United States Patent [19]
Takatsu et al.

[11] Patent Number: 4,743,778
[45] Date of Patent: May 10, 1988

[54] SOLID-STATE AREA IMAGING DEVICE HAVING INTERLINE TRANSFER CCD

[75] Inventors: Norihiko Takatsu; Yoshio Nara, both of Tokyo; Tetsuya Yamamoto, Hasuda, all of Japan

[73] Assignee: Nippon Kogaku K. K., Tokyo, Japan

[21] Appl. No.: 9,625

[22] Filed: Jan. 23, 1987

Related U.S. Application Data

[63] Continuation of Ser. No. 840,921, Mar. 18, 1986, abandoned.

[30] Foreign Application Priority Data

Mar. 25, 1985 [JP] Japan .................................. 60-60270
Jul. 22, 1985 [JP] Japan ................................ 60-161430
Jul. 22, 1985 [JP] Japan ................................ 60-161431

[51] Int. Cl.$^4$ ...................... H03K 3/42; H01L 29/78; H01L 27/14; H04N 3/14
[52] U.S. Cl. ...................... 307/311; 357/24; 357/30; 358/213.19; 358/213.31; 377/58
[58] Field of Search ................ 357/24, 30; 377/57-63; 358/213.19, 213.23-213.31; 307/311

[56] References Cited

U.S. PATENT DOCUMENTS

| | | | |
|---|---|---|---|
| 3,623,026 | 11/1971 | Engeler et al. | 357/30 |
| 3,931,463 | 1/1976 | Levine | 357/24 LR |
| 3,931,465 | 1/1976 | Levine | 357/24 LR |
| 3,934,161 | 1/1976 | Caywood | 357/24 LR |
| 3,996,600 | 12/1976 | Patrin | 357/24 LR |
| 4,032,976 | 6/1977 | Levine | 357/24 LR |
| 4,079,422 | 3/1978 | Anagnostopoulos | 357/24 LR |
| 4,245,164 | 1/1981 | Funahashi | 357/24 LR |
| 4,322,753 | 3/1982 | Ishihara | 357/24 LR |
| 4,328,432 | 5/1982 | Yamazaki | 377/58 |
| 4,485,315 | 11/1984 | Collet et al. | 357/24 LR |
| 4,527,182 | 7/1985 | Ishihara et al. | 357/24 LR |

Primary Examiner—Gene M. Munson
Attorney, Agent, or Firm—Shapiro and Shapiro

[57] ABSTRACT

A solid state image pick-up device in which a light-receiving portion of MOS diode structure for accumulating therein charges corresponding to the intensity of light is formed on a substrate includes discharging means for discharging the accumulated charges into the substrate, and control means for controlling the discharging means in accordance with the exposure time of the solid state image pick-up device.

8 Claims, 13 Drawing Sheets

FIG. 4D (a) DP1
(b) OUTPUT OF COUNTER 16
(c) OSP1
(d) OSP2
(e) DP3
(f) Q̄ OF DFF 180
(g) OUTPUT OF OR1

SOLID-STATE AREA IMAGING DEVICE HAVING INTERLINE TRANSFER CCD

This is a continuation application of Ser. No. 840,921, filed Mar. 18, 1986, now abandoned.

BACKGROUND OF THE INVENTION

1. Field of the Invention

This invention relates to a solid state image pick-up device contained in an electronic still camera, a video camera or the like.

2. Related Background Art

As a solid state image pick-up device used in an electronic still camera, use has heretofore been made of an interline transfer type CCD capable of temporarily storing light signal charges in the other portion than a light-receiving portion, and the electronic shutter function in this interline transfer type CCD is performed by the use of an overflow drain (hereinafter referred to as "OFD") and an overflow control gate (hereinafter referred to as "OFCG") for controlling the accumulation and discharge of light signal charges in the light-receiving portion (Japanese Laid-open patent application No. 44271/1981).

That is, OFD and OFCG have the function of discharging excess charges so that the blooming phenomenon may not occur when excessive light signal charges are produced in the light-receiving portion, and further, by adjusting the OFCG voltage, the amount of signal charges which can be accumulated in the light-receiving portion can be controlled. So, as an electronic shutter, the OFCG voltage is controlled in time to a state in which signal charges cannot be accumulated in the light-receiving portion and to a state in which normal accumulation is possible, whereby the exposure time of the light-receiving portion may be determined and the shutter function can be realized by the solid state image pick-up device itself.

In recent years, however, due to the high resolution of the solid state image pick-up device, the number of light-receiving portions has increased, and with such increase in the number of light-receiving portions, the simplification of the transfer gate and the OFCG structure has been achieved and there has been the advent of an interline transfer type CCD which cannot singly control OFCG.

With regard to such a solid state image pick-up device which cannot singly control OFCG, it would involve great difficulties to realize the shutter function by the solid state image pick-up device itself using the conventional control of the OFCG voltage, and this has led to a problem that the conventional mechanical shutter must be resorted to.

Also, a video camera capable of operating at a high shutter speed has the advantages that the dynamic resolution during normal operation is improved and that clear-cut images free of blur are obtained during slow motion reproduction or still reproduction, but yet it has suffered from a disadvantage that the necessity of providing a mechanical rotary shutter in front of the image pick-up device makes the entire apparatus bulky and heavy and accordingly incovenient to handle.

SUMMARY OF THE INVENTION

It is an object of the present invention to provide a solid state image pick-up device having no overflow control gate and yet having a shutter function.

It is another object of the present invention to provide a solid state image pick-up device having the function as a shutter operable at a high speed.

To achieve the above objects, the present invention consists in a solid state image pick-up device having a light-receiving portion of MOS diode structure and wherein a voltage applied to an electrode provided on the solid state image pick-up device is controlled in accordance with the exposure time to make the light-receiving portion capable of accumulating charges therein.

To achieve said another object, the present invention is designed such that the exposure period is set within the vertical blanking period of a video camera or within a period including said vertical blanking period and moreover high-speed charge transfer of the vertical transferring portion of CCD is effected within the exposure period to thereby discharge unnecessary charges in the light-receiving portion.

DESCRIPTION OF THE PREFERRED EMBODIMENTS

Figure 1:
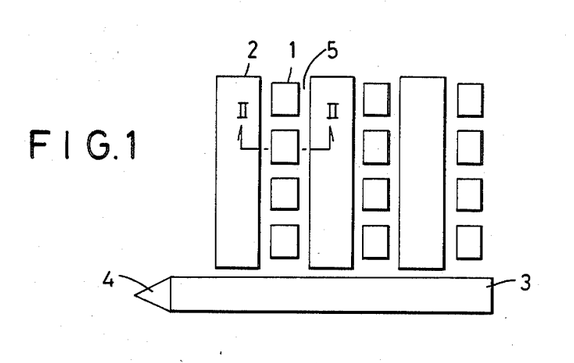
FIG. 1 is a schematic view of an interline transfer type CCD.

Referring to FIG. 1, a light-receiving portion 1 is designed to accumulate therein signal charges photoelectrically converted by the use of not a p-n junction photodiode but an MOS diode. A vertical transferring portion 2 transfers the signal charges of the light-receiving portion 1 to a horizontal transferring portion 3. The horizontal transferring portion 3 transfers the signal charges in a horizontal line transferred thereto from the vertical transferring portion 2 to a floating diffusion amplifier 4. The floating diffusion amplifier 4 converts the signal charges transferred thereto from the horizontal transferring portion 3 into a signal voltage and put out it.

On the other hand, reference numeral 5 designates OFD and OFCG which serve to discharge any excessive charges when more signal charges than the charges transferrable by the vertical transferring portion 2 are generated in the light-receiving portion 1. The OFD and OFCG cannot be controlled singly.

Figure 2A:
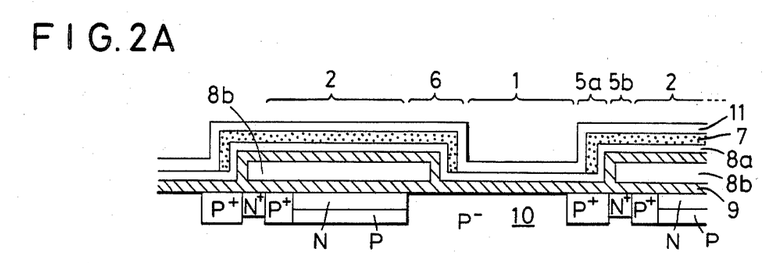
FIGS. 2A, 2B, 2C and 2D are cross-sectional views taken along line II—II of FIG. 1 and showing the potential states of the CCD.

In the cross-sectional structure of FIG. 2A, aluminum 7 intercepts the light to the vertical transferring portion 2, and below the aluminum 7, there is provided a transparent polysilicon electrode 8a forming a sensor gate (hereinafter referred to as "SG"). A polysilicon electrode 8b surrounded by silicon oxide ($SiO_2$) 9 provides the electrode of the vertical transferring portion 2.

In such a cross-sectional structure, the polysilicon electrode 8b of the vertical transferring portion 2 serves also as a transfer gate and, when the electrode voltage of the polysilicon electrode 8b is operated at three levels and the voltage is highest, the polysilicon electrode 8b performs the function as the transfer gate. Also, the OFCG 5a is common to the SG formed by the polysilicon electrode 8a and accordingly, the OFCG 5a cannot be controlled singly.

Further, considering the structure of the light-receiving portion 1, it has a layered structure of the SG comprising the polysilicon electrode 8a, the silicon oxide ($SiO_2$) 9 and a P type silicon substrate 10, and forms not a p-n junction photodiode but a photodiode of MOS structure. A transparent protective film 11 is formed on the surface of the light-receiving portion.

Figure 3A:
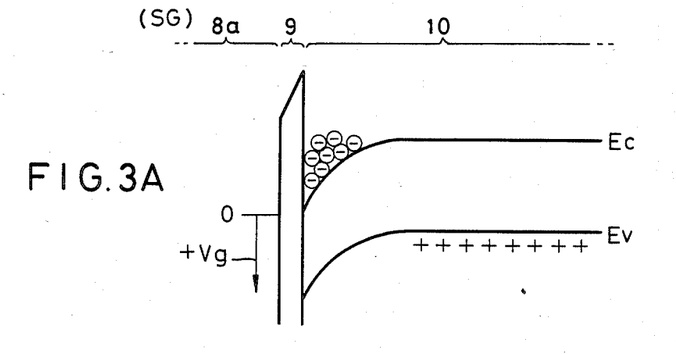
FIGS. 3A and 3B are charge distribution graphs illustrating the principle of the present invention.

FIG. 3A shows the charge distribution when a voltage of $+Vg$ is applied to the electrode SG, and electrons are stored in the interface between the P type silicon 10 and the silicon oxide ($SiO_2$) 9. However, the potential of the P type silicon substrate 10 is 0V. When this electrode voltage is grasped in the fashion of a direct current, the electrons stored in the interface become electrons generated by thermal excitation, but in the case of CCD, the electrode voltage is applied in the fashion of a pulse and is thermally operated in a non-steady state, whereby the generation of thermally excited electrons is prevented, and only the signal charges by light are stored in the interface between the P type silicon substrate 10 and the silicon oxide ($SiO_2$) 9. The accumulated state of the signal charges shown in FIG. 3A is called the inversion type.

Figure 3B:
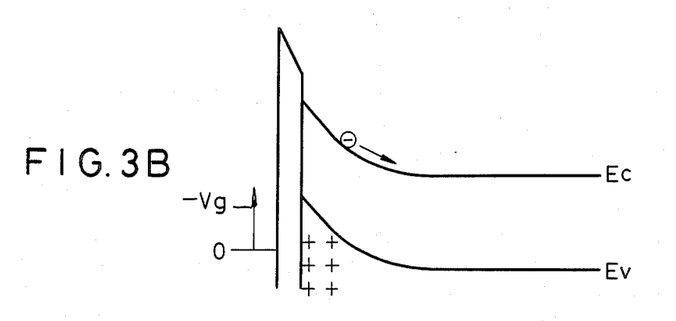

In contrast, the charge distribution when a voltage of $-Vg$ is applied to the polysilicon electrode 8a constituting the sensor gate assumes the potential state shown in FIG. 3B, and the electrons are driven out from the interface between the P type silicon substrate 10 and the silicon oxide ($SiO_2$) 9 into the inmost part of the P type silicon substrate 10 and instead, holes are stored in the interface portion. This state is called the accumulation type. When the accumulation type state is thus brought about by the application of the sensor gate voltage $-Vg$, the electrons of the signal charges can all be discharged toward the substrate side even if they are not discharged to OFD, and in the light-receiving portion, a state in which there is no signal charge can be realized by controlling the sensor gate voltage to $-Vg$.

That is, control of the shutter time which is the time during which the signal charges are accumulated becomes possible by controlling the light-receiving portion to the inversion type state shown in FIG. 3A and the accumulation type state shown in FIG. 3B.

Figure 4A:
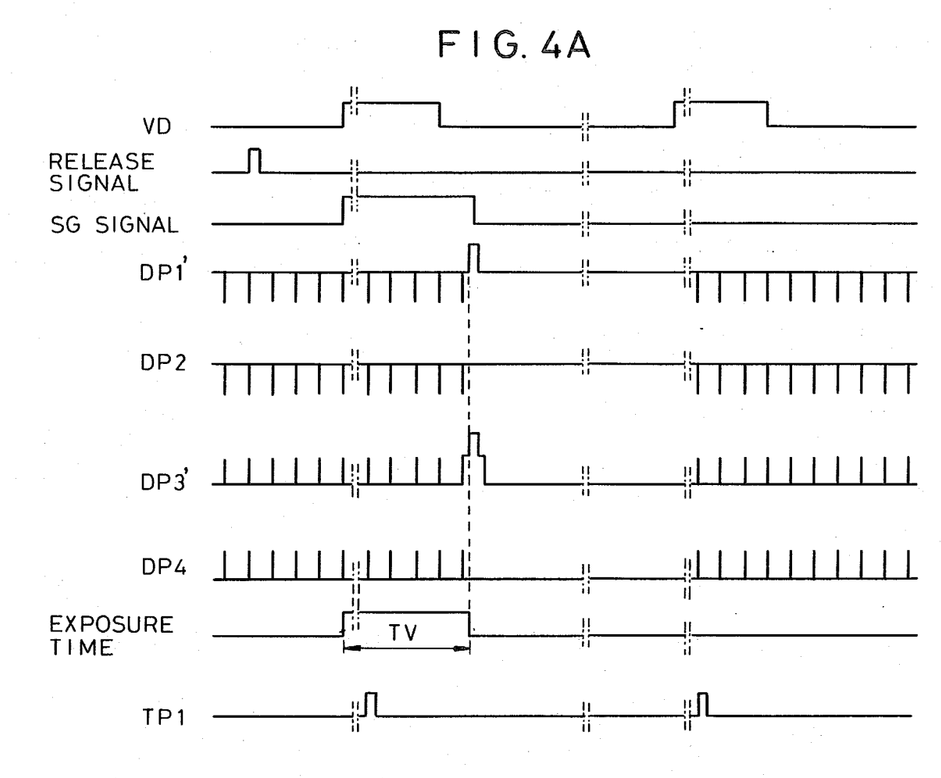
FIG. 4A is a timing chart in a case where a first embodiment of the present invention is applied to an electronic still camera.
Figure 4B:
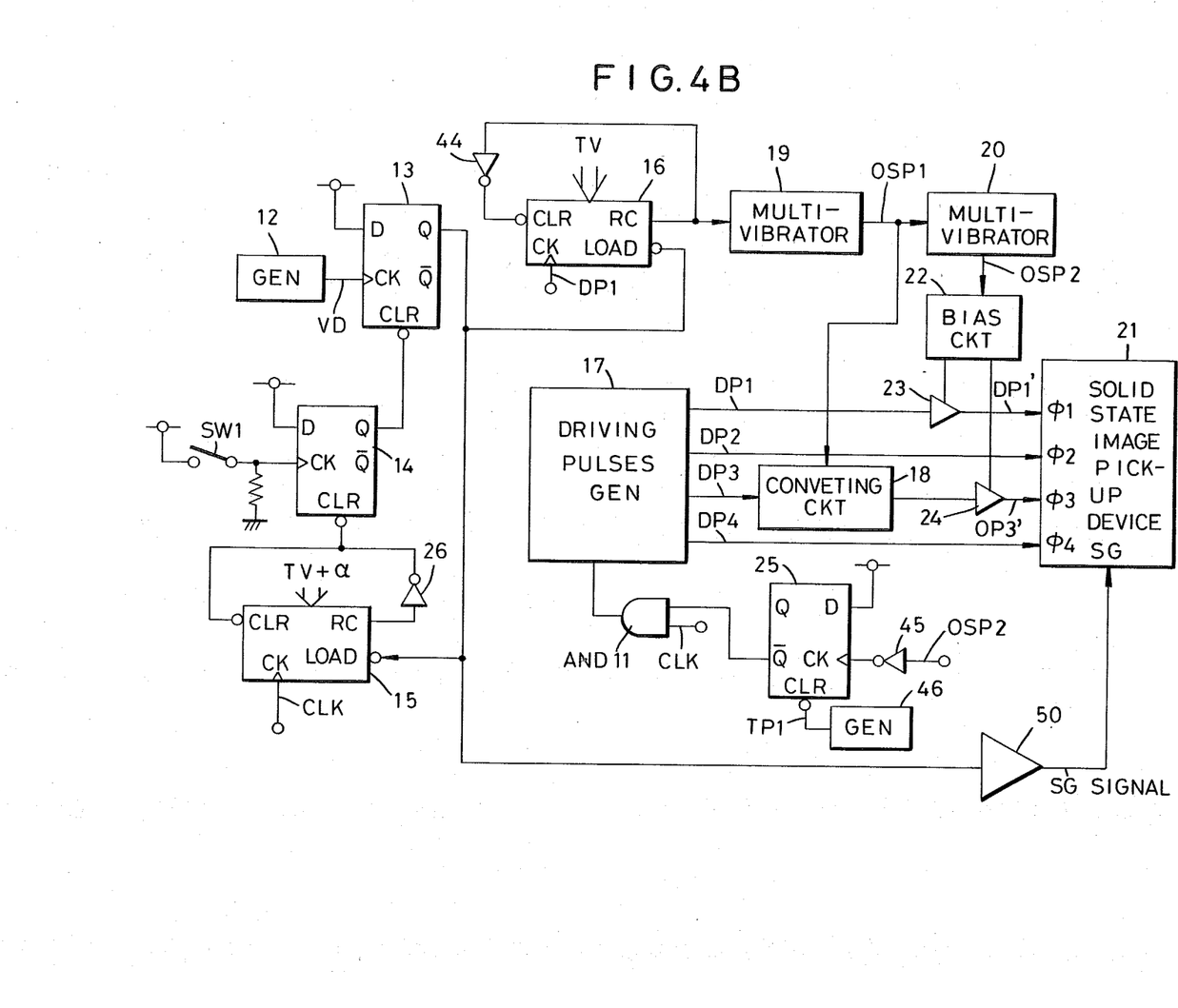
FIG. 4B is a circuit diagram in the case where the first embodiment of the present invention is applied to an electronic still camera.
Figure 4C:
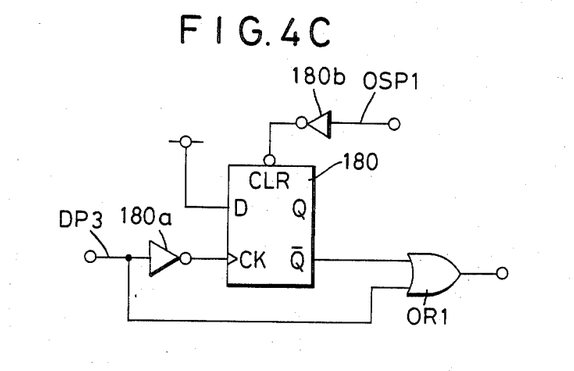
FIG. 4C shows a part of the circuit shown in FIG. 4B.
Figure 4D:
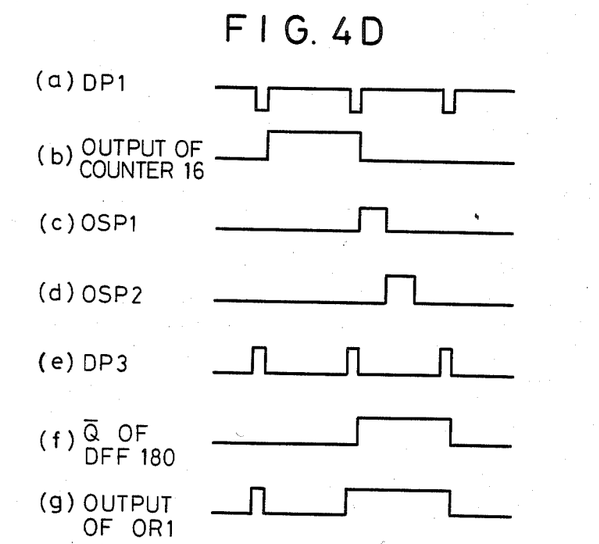
FIG. 4D is a timing chart showing the operation of the circuit of FIG. 4C.

In FIG. 4B, a generator 12 which generates a vertical drive signal (hereinafter referred to as VD) inputs VD to the terminal CK of a D-flip-flop (hereinafter referred to as DFF) 13. A switch SW1 is closed in response to the depression of the release button of an electronic still camera, whereby the terminal CK of DFF 14 assumes H level. Immediately after the switch SW1 has been closed, the terminal RC of a counter 15 assumes L level because the output of the terminal Q of DFF 13 is at L level, and H level is input to the terminal CLR of DFF 14 by an inverter 26. Accordingly, immediately after the switch SW1 has been closed, the terminal Q of DFF 14 is at H level. The generator 12 prepares VD on the basis of the reference pulse of a crystal oscillator or the like. The period of VD is 1/60 second and corresponds to the reading-out period of the video signal of one field in a video camera or the like. The output of the terminal Q of DFF 13 changes from L level to H level in response to the rising of VD. Thereby, a counter 16 reads a digital signal indicative of the exposure time (hereinafter referred to as TV) which is produced by CPU or the like, in accordance with a shutter dial or a photometering circuit provided in the electronic still camera. The counter 16 counts a drive signal DP1 which will be described later, and produces an output of H level from its terminal RC when a time corresponding to the set TV elapses. A one-shot multivibrator 19 generates a pulse OSP1 in response to the H level output of the terminal RC of the counter 16. A driving pulse generator 17 prepares, on the basis of a reference pulse CLK, pulses DP1, DP2, DP3 and DP4 for driving a solid state image pick-up device. The output of the terminal $\overline{Q}$ of DFF 25 changes from H level to L level in response to the falling of a pulse OSP2 put out from a one-shot multivibrator 20 in response to the falling of OSP1. The generator 17 receives the pulse CLK as an input through AND 11 during the period during which the output of the terminal $\overline{Q}$ of DFF 25 is at H level. A generator 46 generates a transfer pulse TP1 of the same period as VD. A converting circuit 18 is of a structure as shown in FIG. 4C and effects an operation as shown in FIG. 4D. A bias circuit 22 raises the driving potentials of buffers 23 and 24 in response to OSP2 and prepares DP1' and DP2' shown in FIG. 4A. DP1-DP4 are four-phase pulses, and DP1 and DP2 are equal in duty ratio to each other and have a predetermined phase difference therebetween, and DP3 and DP4 are equal in duty ratio to each other and have a predetermined phase difference therebetween. A counter 15 counts the time corresponding to $TV+\alpha$ set by CPU or the like, in response to the rising of the output of the terminal Q of DFF 13 from L level to H level, on the basis of CLK, and renders the output of the terminal RC thereof into H level. The terminal CLR of DFF 14 is caused to assume L level by an inverter 26 when the output of the terminal RC of the counter 15 assumes H level, and the termnal Q of DFF 14 assumes L level and further, the terminal Q of DFF 13 assumes L level. The output of the terminal Q of DFF 13 is input to SG as an SG signal having a potential of +Vg during its high level and a potential of −Vg during its low level, by an amplifier 49.

In FIG. 4A, the inversion type state and the accumulation type state can be controlled by a voltage applied to the sensor gate SG, and when the voltage applied to SG is at a high level (hereinafter referred to as H level), the inversion type state of the light-receiving portion shown in FIG. 3A is obtained and accumulation of light signal charges becomes possible, and on the other hand, when the voltage applied to SG is at a low level (hereinafter referred to as L level), the light-receiving portion assumes the accumulation type state shown in FIG. 3B and the light signal charges produced in the light-receiving portion can be discarded into the inmost part of the substrate. Thus, the time during which SG remains at H level is the shutter time.

Figure 2B:
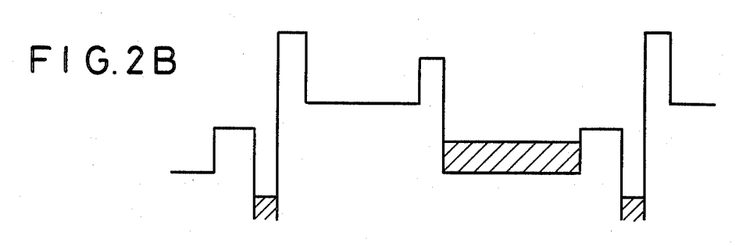

During the normal video operation, a voltage +Vg is always applied to the SG of the light-receiving portion 1 and therefore, as shown in FIG. 2B, the potential of TG 6 is higher than the potentials of the light-receiving portin 1 and OFCG 5a.

Figure 2C:
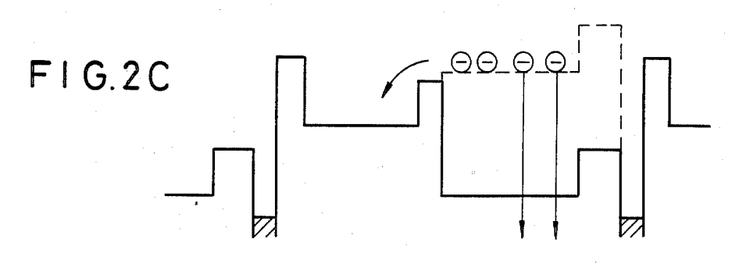
Figure 2D:
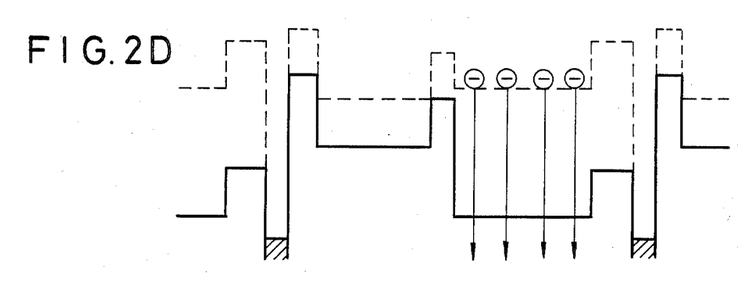

However, when the voltage of the SG of the light-receiving portion 1 is changed to −Vg, only the potential of the light-receiving portion 1 changes to the state indicated by broken line in FIG. 2C, and the potential of TG 6 becomes lower than the potentials of the light-receiving portion 1 and OFCG 5a and leakage of charges from the light-receiving portion 1 into the vertical transferring portin 2 occurs. This makes it necessary to make the potential of TG 6 higher than the potential of the light-receiving portion 1, and also as regards the voltage applied to the vertical transferring portion 2, it is necessary to apply a voltage lower than the voltage of SG and thereby provide a higher potential. The potential state when a negative voltage is thus imparted to the vertical transferring portin 2 is shown by broken line in FIG. 2D. If this potential state shown by the broken line is obtained, the potential of the light-receiving portion 1 is lower than the potentials of OFCG 5a and TG 6 and further, above all, the inmost part of the substrate is lower in potential and thus, it becomes possible to reliably discharge the signal charges in the light-receiving portion 1 into the inmost part of the substrate of the light-receiving portion 1.

The field of the image signal changes at the rising of the vertical drive signal VD. When the shutter button is depressed, a release signal enters and exposure is started at the rising of the next VD. At the timing before this exposure the SG signal is at L level and therefore, as shown in the potential state of FIG. 5A, the signal charges produced in the light-receiving portion 1 are all discharged into the inmost part of the substrate.

Figure 5A:
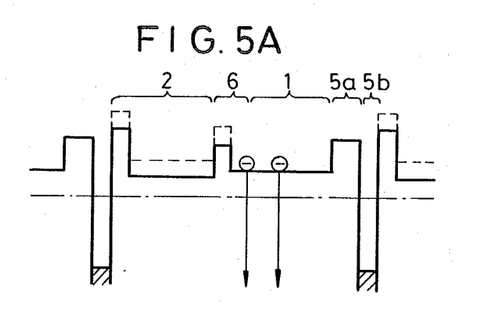
FIGS. 5A, 5B, 5C, 5D and 5E show the potential states of a solid state image pick-up device.
Figure 5B:
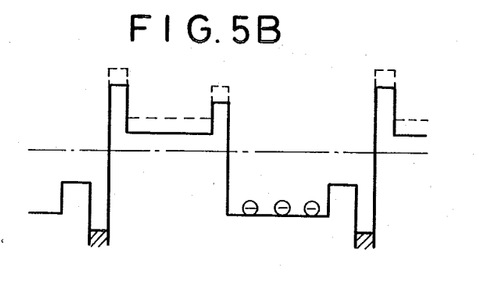

The exposure is started by the SG signal assuming H level, and during the exposure period, light signal charges are accumulated in the light-receiving portion 1 as is apparent from FIG. 5B.

Figure 5C:
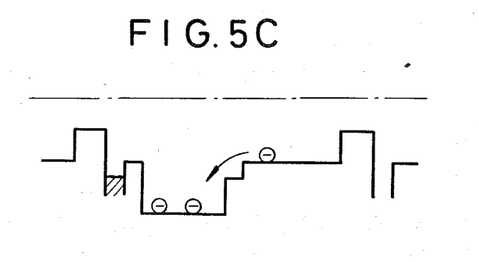
Figure 5D:
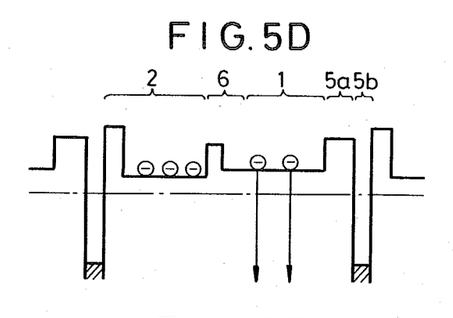
Figure 5E:
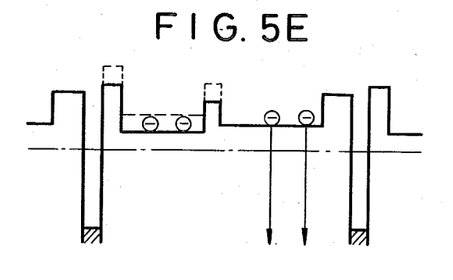

When a predetermined shutter time elapses, the SG signal restores L level and at a point of time whereat the exposure is terminated, the driving pulses DP1 and DP3 for the transfer in the vertical direction assume the highest level. As a result, as is apparent from the potential state of FIG. 5C which shows the exposure termination timing, the vertical transferring portion 2 and TG 6 assume a potential lower than the potential of the light-receiving portion 1, and the signal charges accumulated in the light-receiving portion 1 are transferred to the vertical transferring portion 2. When this transfer of the signal charges to the vertical transferring portion 2 is terminated, the driving pulse generator 17 stops generating DP1-DP4, and as shown in FIG. 5D, it restores the same state as FIG. 5A, and the signal charges produced in the light-receiving portion are discarded into the inmost part of the substrate. At this time, the signal charges transferred to the vertical transferring portion 2 are held in the vertical transferring portion 2 until the terminal Q of DFF 25 assumes H level, and when the terminal Q of DFF 25 assumes H level, said signal charges are read out at a timing similar to the normal video operation as shown in FIG. 5E. The dot-and-dash line in FIGS. 5A–5E indicates the potential of the substrate 10.

Figure 6A:
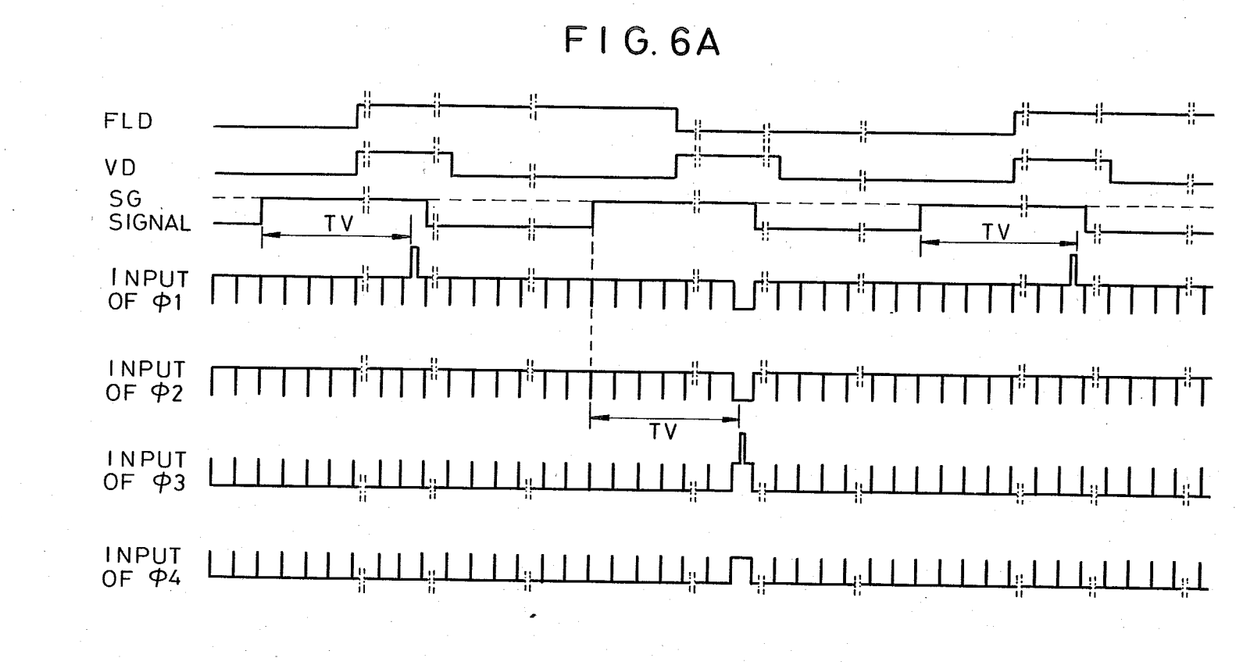
FIG. 6A is a timing chart in a case where the first embodiment of the present invention is applied to a video camera.

In FIG. 6A, FLD is a field signal, and represents an off field when it is in H level state, and represents an even field when it is in L level state. Control of SG is basically the same as the case of the electronic still camera shown in the timing chart of FIG. 4A, and accumulation of light signal charges is effected in the light-receiving portion 1 when the SG signal is at H level, and discharge of the signal charges from the light-receiving portion 1 into the inmost part of the substrate is effected when the SG signal is at L level.

The video camera effecting the operation shown in the timing chart of FIG. 6A has solid state image pickup device 21 operated by the four-phase driving pulse shown in FIG. 4B, and the four-phase pulse driving this solid state image pick-up device 21 is similar to the conventional one in which the exposure time is 1/30 second, and a feature thereof is the control of the SG signal.

Figure 6B:
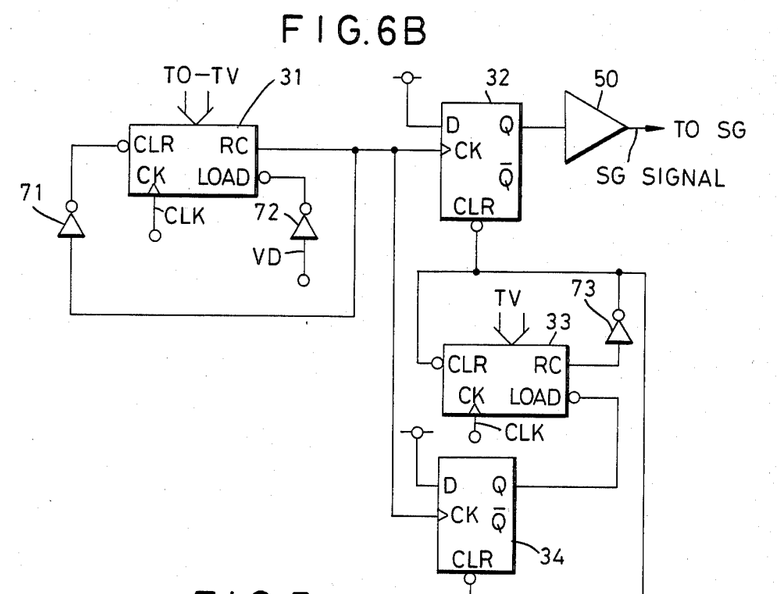
FIG. 6B is a circuit diagram in the case where the first embodiment of the present invention is applied to a video camera.

In FIG. 6B, a counter 31 receives VD as an input by its terminal LOAD through an inverter 72, and counts, on the basis of CLK, the time corresponding to To–Tv set by CPU or the like in response to the rising of VD (To is a time correspoinding to one period of VD). During the period during which the counter 31 counts said time, the terminal CLR of DFF 34 is at H level, the terminal RC of a counter 33 is at L level and the terminal CLR of DFF 32 is at H level by an inverter 73. When the counter 31 counts To–Tv, the terminal RC thereof assumes H level and the terminal Q of DFF 32 assumes H level. When the terminal RC of the counter 31 assumes H level, the terminal Q of DFF 34 assumes H level and a counter 33 counts, on the basis of CLK, the time corresponding to TV set by CPU or the like. When the counter 33 counts the time TV, the terminal RC of the counter 33 assumes H level and the terminal Q of DFF 32 assumes L level.

In an electronic still camera according to a second embodiment of the present invention, the SG signal differs from that in the first embodiment, and the pulse input to the drives $\phi_1$–$\phi_4$ of a solid state image pick-up device is similar to that in the case of the conventional video camera in which the exposure time is 1/60 second.

Figure 7:
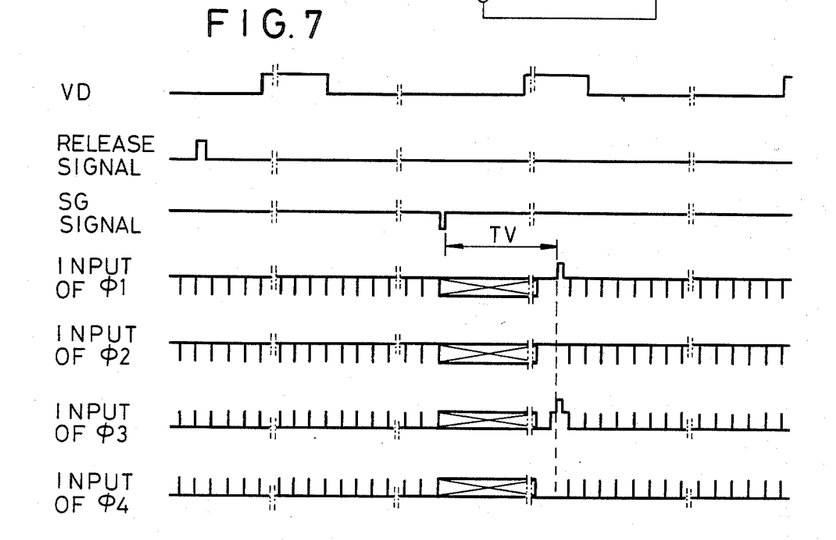
FIG. 7 is a timing chart of a second embodiment of the present invention.

The timing chart of FIG. 7 will now be described. The operation before exposure is the same as the normal video operation with the exception that all the voltages of the vertical transferring electrodes operate in a negative voltage area, and in the potential state of the interface at this point of time, as shown in FIG. 5B, the potential of TG 6 is higher than the potentials of the light-receiving portion and OFCG 5a.

Subsequently, the SG signal is rendered into L level to discharge the unnecessary voltage from the light-receiving portion 1 as shown in FIG. 5A.

According to this discharging operation, the unnecessary charges accumulated in the light-receiving portion 1 are discharged from the light-receiving portion 1 to the substrate side, but since the potential of the part of the vertical transferring portion 2 inner than the interface is lower than the potential of the substrate, some of the charges to be discharged go round to the vertical transferring portion 2.

So, in order to cause the unnecessary charges going round to the vertical transferring portion to be discharged out of the sensor, the vertical transferring gates $\phi_1$, $\phi_2$, $\phi_3$ and $\phi_4$ are operated at a high speed for a predetermined time from the point of time at which the SG signal rises from L level to H level, thereby effecting the high-speed charge transfer of the vertical transferring portion. By this high-speed charge transfer, the unnecessary charges are read out of the sensor and at a later point of time, the highest voltage of three-value level is applied to the vertical transferring gate $\phi_1$ and the potential of the light-receiving portion 1 is made higher than that of the vertical transferring portion side, whereby the signal charges accumulated in the light-receiving portion are transferred to the vertical transferring portion.

The charges thus transferred to the vertical transferring portion are read out thereafter in the same manner as the normal video operation.

Figure 8:
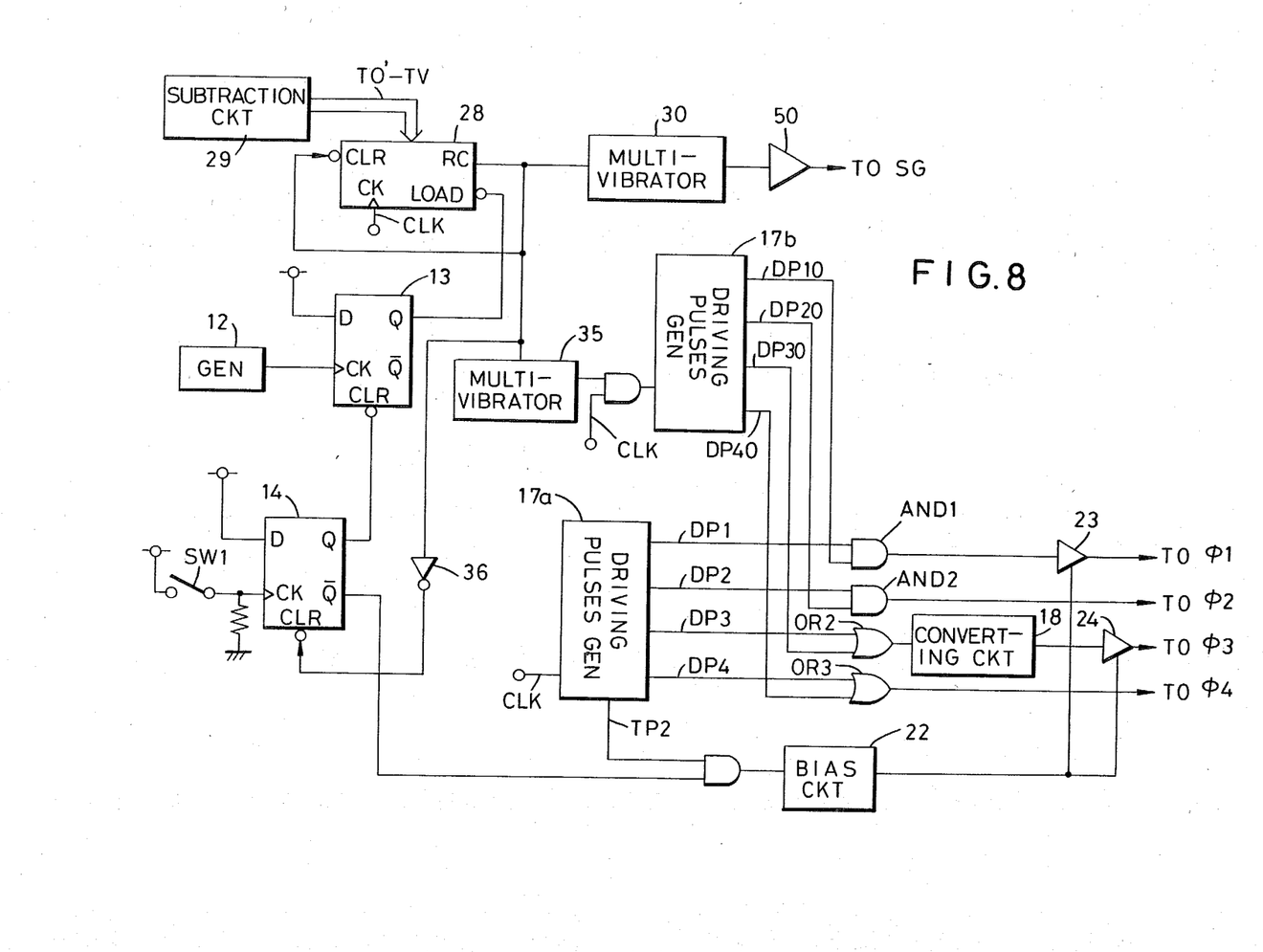
FIG. 8 is a circuit diagram of a second embodiment of the present invention.

In FIG. 8, a switch SW1, DFF 13, DFF 14, a generator 12, a converting circuit 18, buffers 23 and 24 and a bias circuit 22 are similar to those in FIG. 4B. After the release button has been depressed, a counter 28 counts, on the basis of CLK, the time corresponding to To′−Tv set by a subtraction circuit 29, in response to the rising of VD. To′ is the aforementioned period To minus the period from when the signal input to the gate $\phi_1$ assumes the maximum one of the three-value levels until VD falls. A one-shot multivibrator 30 generates a pulse which assumes L level for a predetermined period, in response to the H level of the terminal RC of the counter 28. An amplifier 50 amplifies the pulse of the multivibrator 30 and inputs it to SG. Also, a one-shot multivibrator 35 generates a pulse which assumes H level for a period necessary for the high-speed transfer of the vertical transferring portion, in response to the H level of the terminal RC of the counter 28. A driving pulse generator 17b prepares, on the basis of CLK, driving pulses $DP_{10}$, $DP_{20}$, $DP_{30}$ and $DP_{40}$ of shorter period than DP1–DP4 for a period during which the output of the multivibrator 35 is at H level, for the high-speed transfer of the vertical transferring portion. A driving pulse generator 17a prepares, on the basis of CLK, the aforementioned pulses DP1–DP4 and a pulse TP2 for raising the inputs of the gates $\phi_1$ and $\phi_3$ to the maximum one of three-value levels. The pulse TP2 is of the same period as VD. An AND gate AND1 superposes $DP_{10}$ upon DP1, and an AND gate AND2 superposes $DP_{20}$ upon DP2. An OR gate OR2 superposes $DP_{30}$ upon DP3, and an OR gate OR3 superposes $DP_{40}$ upon DP4. The subtraction circuit 29 may be CPU as in the case of FIG. 6B.

FIGS. 9(a)–(h) show the video operation of a video camera of a shutter speed of 1/2000 second.

BLK signal is a blanking signal.

The vertical blanking period corresponds to a period during which the CLK signal is at H level.

Figure 9:
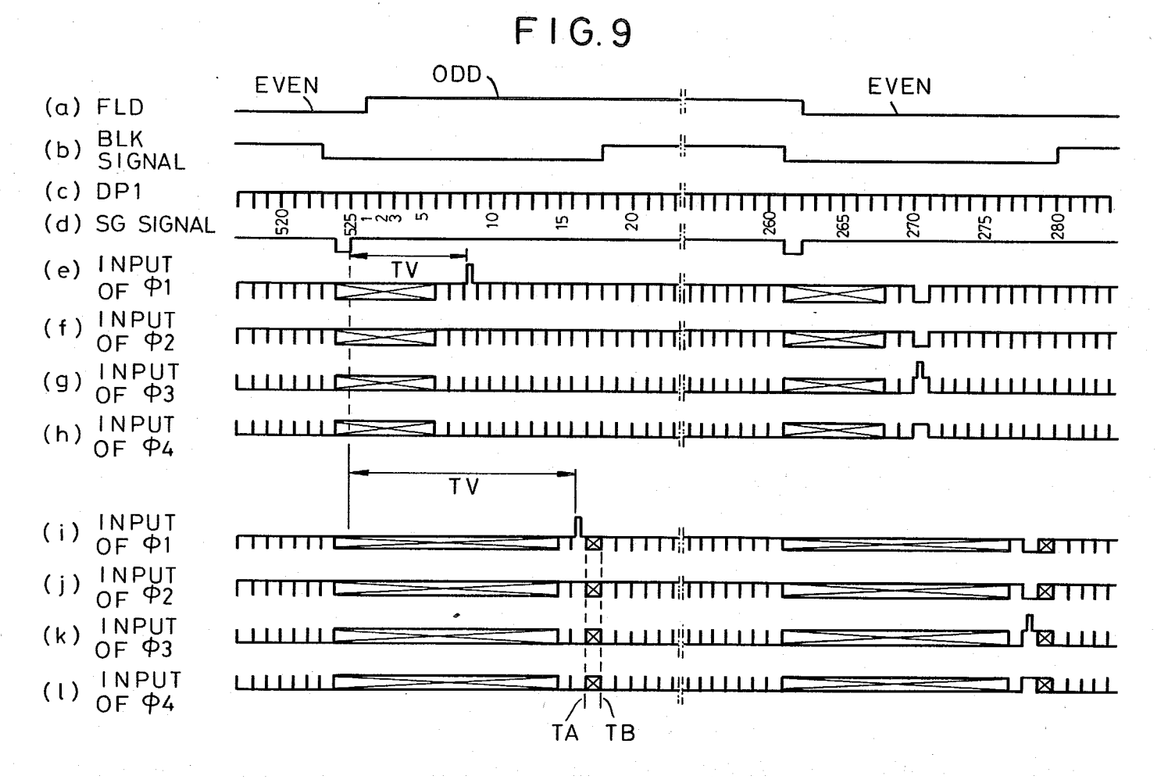
FIG. 9 is a timing chart in a case where the shutter speeds are 1/2000 second and 1/1000 second in a third embodiment of the present invention.

When the SG signal is rendered into L level as shown in FIG. 9(d), the signal charges accumulated in the light-receiving portion 1 for a period corresponding to about one field are discharged into the substrate and thus, the charges are eliminated from the light-receiving portion.

Here, as previously described, some of the charges go round to the vertical transferring portion side and therefore, high-speed charge transfer is effected to eliminate these charges, and the charges going round to the vertical transferring portion side are discharged out of the sensor.

When the SG signal is again rendered into H level, accumulation of light signal charges is newly started. Within the period of high-speed charge transfer, vertical transfer of 263 steps corresponding to at least one scan of a field signal is effected and by this transfer, the unnecessary charges in the vertical transferring portion are completely eliminated.

Subsequently, the input of the vertical transferring electrode $\phi_1$ is raised to the highest one of three-value levels, and the signal charges accumulated in the light-receiving portion are transferred to the vertical transferring portion.

Subsequently, until the SG signal assumes L level, the normal video operation continues and the charges are read out by the vertical transferring portion.

In an even field also, as in an odd field, CCD is driven and therefore, an image photographed by a high-speed shutter can be obtained.

The driving operation of a video camera of a shutter speed of 1/1000 second will now be described with reference to FIGS. 9(a)–(d) and (i)–(l).

The vertical blanking period is about 1.3 ms, and from the necessity of allotting a time of about 1 ms to the exposure period, the driving operation somewhat differs from that in the case of a shutter speed of 1/2000 second.

As in the case where Tv is 1/2000 second, the SG signal assumes L level, and high-speed charge transfer is effected, whereby the charges are discharged out of the sensor.

The SG signal assumes H level, whereby accumulation of light signal charges is newly started.

In the normal operation of the video camera, the signal charges in the light-receiving portion are transferred to the transferring portion at the 8.5th point of time of DP1 of FIG. 9(c), but in the case of the driving of a video camera of a shutter speed of 1/1000 second, the signal charges are transferred at the 16.5th point of time of DP1 and therefore, the image signal read out deviates in time by an amount corresponding to 8H.

Accordingly, here, the vertical transferring portion is shifted by eight steps during the period from a point of time TA till a point of time TB so that the image at the shutter speed of 1/1000 second can be displayed. As regards also the even field, the same driving as in the odd field takes place and therefore, the image is displayed without any problem.

Figure 10A:
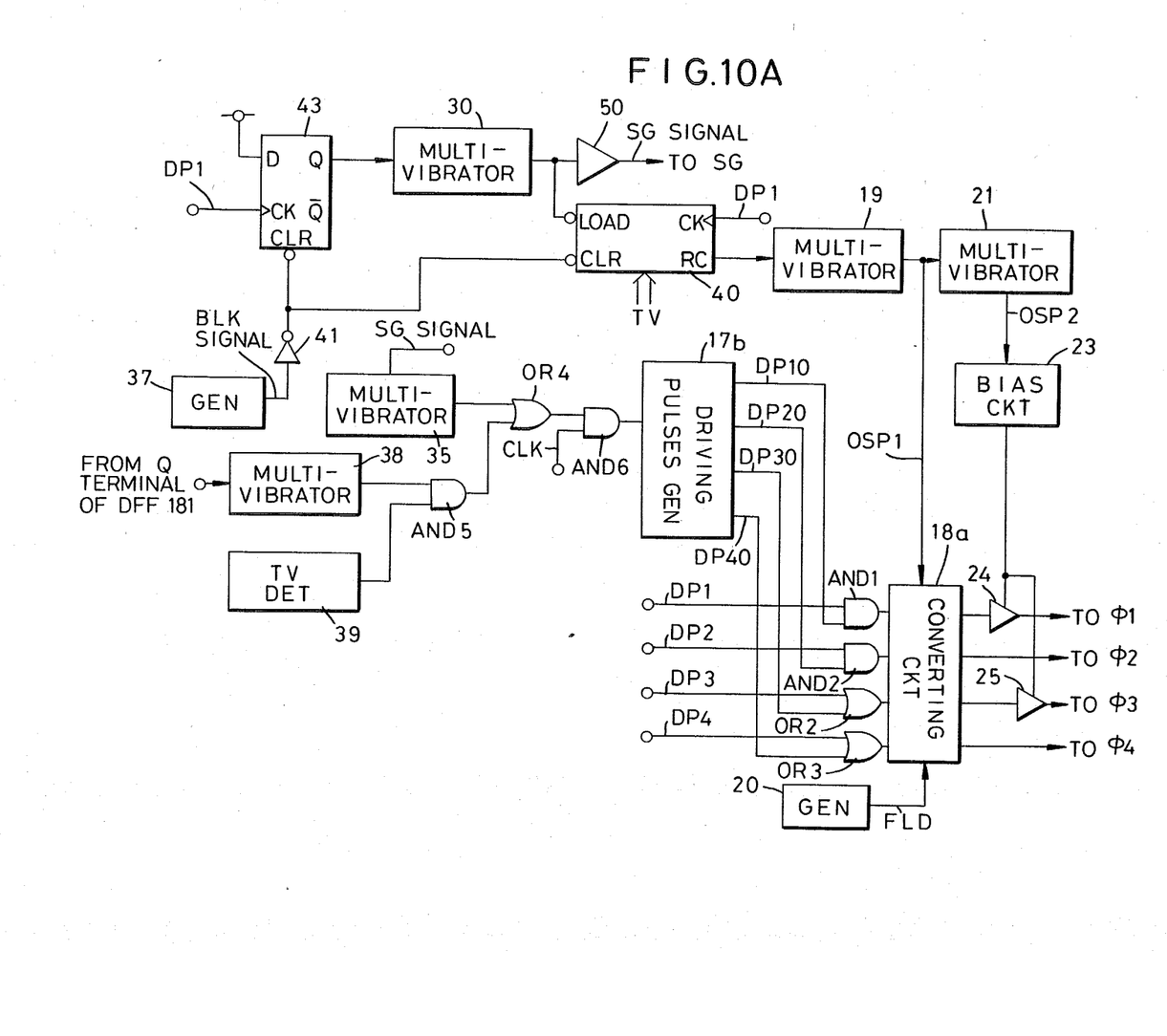
FIG. 10A is a circuit diagram in a case where the shutter speeds are 1/2000 second and 1/1000 second in the third embodiment of the present invention.

In FIG. 10A, multivibrators 19, 21, a bias circuit 23, a driving pulse generator 17b, AND gates AND1 and AND2, OR gates OR2 and OR3, buffers 24 and 25, a multivibrator 35 and an amplifier 50 are similar to those in FIG. 8. A generator 17 and a solid state image pickup device 22 are omitted. A BLK signal generator 37 generates BLK signal. DFF 43 receives DP1 as an input from the terminal CK thereof. During the vertical blanking period, DFF 43 causes its terminal Q to assume H level by an inverter 41 in response to the rising of DP1. A one-shot multivibrator 30 generates, in response to the H level of the terminal Q of DFF 43, a pulse which assumes L level for a period corresponding to the period of DP1. A counter 40 counts, on the basis of DP1, a time corresponding to TV set by CPU, in response to the H level of the output of the multivibrator 30, thereby rendering the terminal RC thereof into H level. The multivibrator 35 generates a pulse in response to the falling of the SG signal. TV detector 39 puts out L level when TV is 1/2000, and puts out H level when TV is 1/1000. A one-shot multivibrator 39 generates, in response to the falling of the output of the terminal Q of the DFF 181 of FIG. 10B, a pulse which assumes H level for a period corresponding to one period of DP1. A generator 20 prepares FLD on the basis of a reference pulse.

Figure 10B:
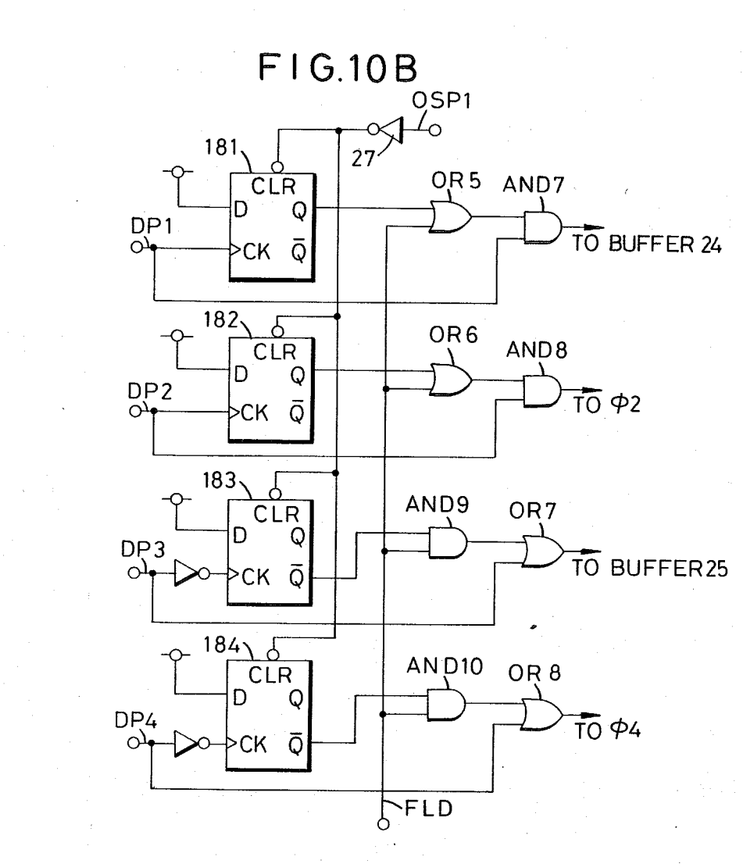
FIG. 10B is a timing chart showing a part of the circuit of FIG. 10A in detail.
Figure 10C:
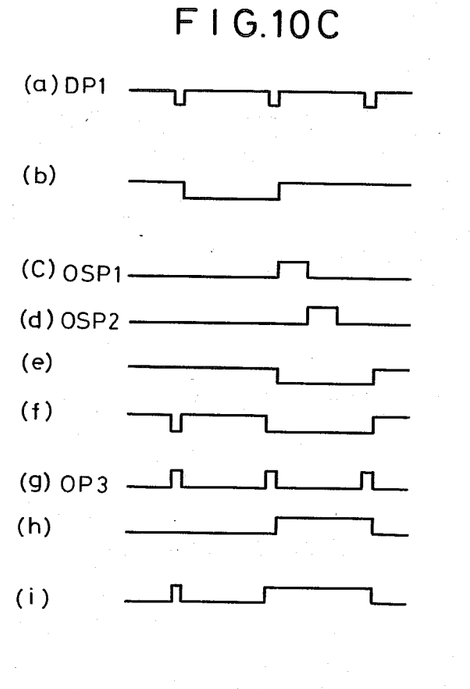
FIG. 10C is a timing chart showing the operation of the circuit of FIG. 10B.

FIG. 10C is a timing chart showing the operation of FIG. 10B, and FIG. 10B shows the construction of the converting circuit 18a of FIG. 10A. In FIG. 10C, (b) shows the inverted signal of the terminal RC of the counter 40, (e) shows the output of the terminal Q of DFF 181, (f) shows the output of an AND gate AND7, (h) shows the output of the terminal $\bar{Q}$ of DFF 183, and (i) shows the output of an AND gate AND10.

Figure 11:
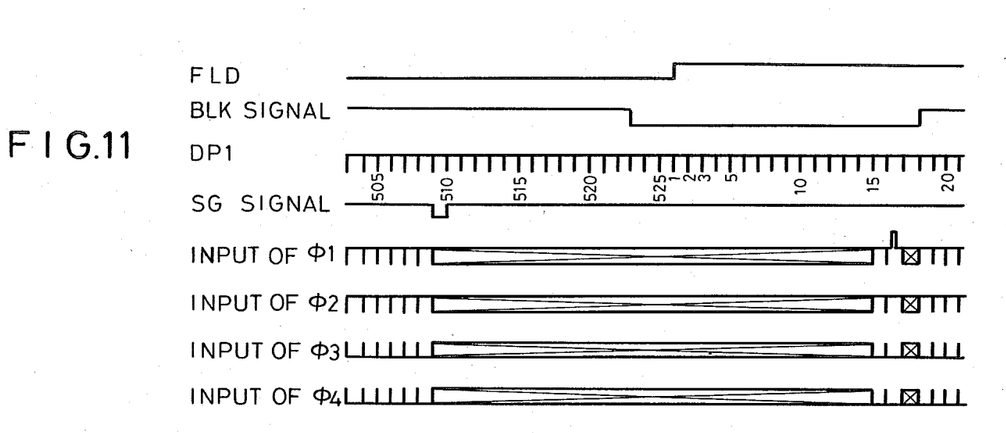
FIG. 11 is a timing chart in a case where the shutter speed is less than 1/100 second in the third embodiment of the present invention.

The driving operation of the video camera when the shutter speed is 1/500 second will now be described with reference to FIGS. 11 and 12.

In this case, driving similar to that when the shutter speed is 1/1000 second with the exception that as compared with the case where the shutter speed is 1/1000 second, the time when the SG signal assumes L level is earlier than the vertical blanking period is effected.

Figure 12:
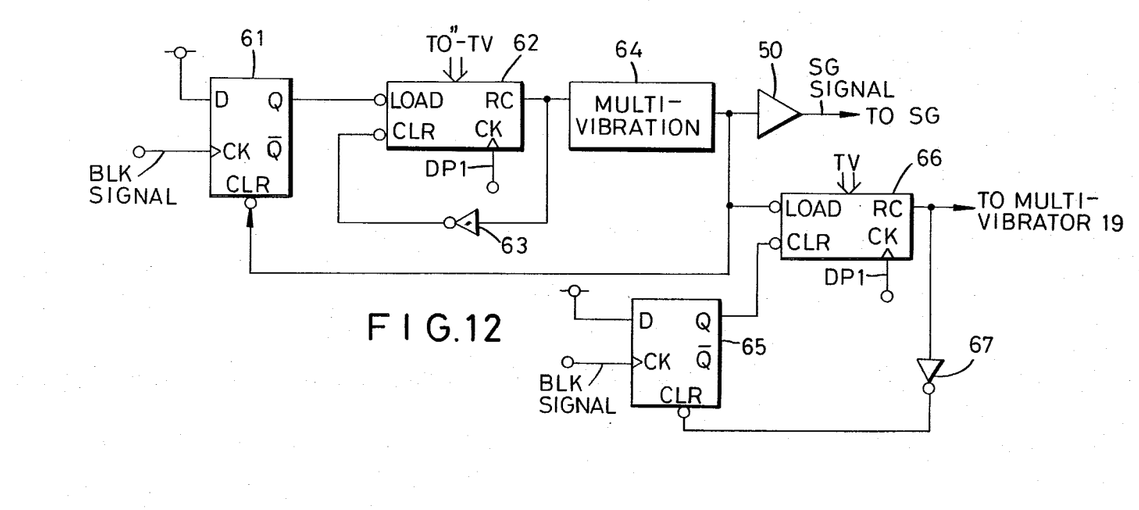
FIG. 12 is a circuit diagram in the case where the shutter speed is less than 1/1000 second in the third embodiment of the present invention.

In FIG. 12, DFF 61 renders its terminal Q into H level in response to the rising of BLK signal. A counter 62 counts, on the basis of DP1, a time corresponding to To″—Tv set by CPU, in response to the H level of the terminal Q of DFF 61 (To″ corresponds to a time corresponding to one period of BLK signal, minus a time corresponding to two periods of DP1). A one-shot multivibrator 64 generates, in response to the H level of the terminal RC of the counter 62, a pulse which assumes H level for the same period as the period of DP1. A counter 66 counts, on the basis of DP1, a time corresponding to TV set by CPU. The counter 66 renders its terminal RC into H level when the counting of the time corresponding TV is completed. In the other points, the construction of FIG. 12 is the same as that of FIG. 10A.

Thus, the effective video signal period decreases and the effective screen of a television decreases by about 5%, but in the ordinary monitor, over-scan is effected and therefore, this construction can be put into practical use.

In the above-described embodiments, an interline transfer type CCD having an MOS diode structure in the light-receiving portion has been shown as the image pick-up means, whereas this is not restrictive, but various solid state image pick-up devices may be used.

Further, usually, when the shutter time is 1/30 second, the stop is too bright and the diffraction phenomenon of the stop has resulted in deteriorated image, but the stop becomes 4–5 steps brighter by the video operation of the high-speed shutter according to the present invention, and this is very effective to eliminate such deterioration of the image.

Also, in this driving, unlike a case where use is made of a mechanical shutter having a forward shutter curtain and a rearward shutter curtain, the entire image pick-up surface is exposed at the same timing and therefore, there can be obtained an excellent high-speed shutter which is free of image distortion.

We claim:

1. A solid state image pick-up device for producing a picture signal, said device comprising:

a semiconductor substrate made of a predetermined chemical element;

photoelectrical conversion means provided with a plurality of light receiving portions disposed on said semiconductor substrate, each of said light receiving portions having a layer of an oxide of said predetermined chemical element, said layer being arranged on said semiconductor substrate, each of said light receiving portions generating charges corresponding to the intensity of incident light thereon;

electrode means disposed on a side of said semiconductor substrate opposite to said layer of each of said light receiving portions;

supplying means for supplying a potential for said electrode means;

control means for causing said supplying means to supply a potential of a first value and a potential of a second value for said electrode means alternatively and for controlling a period in which said supplying means supplies the potential of said second value for said electrode means, the potential of said first value being higher than the potential of said semiconductor substrate, the potential of said second value being lower than the potential of said semiconductor substrate, said supplying means supplying said electrode means with the potential of said first value to cause each of said plurality of light receiving portions to store said charges in an interface between said layer and said semiconductor substrate, said supplying means supplying said electrode means with the potential of said second value to cause each of said plurality of light receiving portions to discharge the stored charges into said semiconductor substrate;

horizontal transfer means for transferring charges externally of said device;

vertical transfer means for transferring charges to said horizontal transfer means;

transfer gate means for transferring said stored charges in said interface to said vertical transfer means;

start means for generating a start signal, said control means causing said supplying means to supply the potential of said second value for a first predetermined period in response to said start signal;

timer means responsive to said start signal for counting a second predetermined period which is shorter than said first predetermined period and for generating a timing signal; and means responsive to said timing signal for causing said transfer gate means to transfer said charges stored in said interface to said vertical transfer means.

2. A solid state image pick-up device according to claim 1, which further comprises inhibition means for inhibiting said vertical transfer means from transferring said charges to said horizontal transfer means and means for controlling a period in which said inhibition means inhibits said vertical transfer means from transferring said charges to said horizontal transfer means.

3. A solid state image pick-up device according to claim 1, which further comprises means for generating a vertical blanking signal indicative of a vertical blanking period of said picture signal, and means for controlling said start means so that said timing signal is generated in said vertical blanking period.

4. A solid state image pick-up device provided with means for generating a blanking signal indicative of a vertical blanking period of a picture signal, said device comprising:

a plurality of light receiving elements each of which generates charges corresponding to an intensity of incident light thereon and stores said charges therein;

vertical transfer means for transferring charges to an output;

transfer gate means for transferring charges stored in said plurality of light receiving elements to said vertical transfer means;

start means for generating a start signal to cause said plurality of light receiving elements to start storing charges therein;

timer means responsive to said start signal for counting a predetermined period of time and generating a timing signal, said transfer gate means transferring the stored charges to said vertical transfer means in response to said timing signal, said predetermined period of time being shorter than said vertical blanking period;

driving means for producing a first driving signal and a second driving signal to drive said vertical transfer means alternatively, said vertical transfer means transferring charges to said output at a first predetermined speed in response to said first driving signal, said vertical transfer means transferring charges to said output at a second predetermined speed greater than said first predetermined speed in response to said second driving signal;

first control means responsive to said start signal for causing said driving means to produce said second driving signal to drive said vertical transfer means for another predetermined period of time which is shorter than the first-mentioned predetermined period of time, said control means causing said driving means to produce said first driving signal to drive said vertical transfer means in response to termination of said another predetermined period of time; and second control means responsive to said blanking signal for controlling said start means so that said start means generates said start signal in said vertical blanking period, wherein said picture signal is produced on the basis of charges which said transfer gate means transfers to said vertical transfer means.

5. A solid state image pick-up device according to claim 4, wherein said first control means comprises another timer means responsive to said start signal for counting said another predetermined period of time and for generating another timing signal, and wherein said control means causes said driving means to produce said first driving signal to drive said vertical transfer means in response to said another timing signal.

6. A solid state image pick-up device for producing a picture signal, said device comprising;

a plurality of light receiving elements each of which generates charges corresponding to an intensity of incident light thereon and stores said charges therein;

vertical transfer means for transferring charges to an output;

transfer gate means for transferring charges stored in said plurality of light receiving elements to said vertical transfer means;

start means for generating a start signal to cause said plurality of light receiving elements to start storing charges therein;

timer means responsive to said start signal for counting a predetermined period of time and generating a timing signal, said transfer gate means transferring the stored charges to said vertical transfer means in response to said timing signal;

driving means for producing a first driving signal and a second driving signal to drive said vertical transfer means alternatively, said vertical transfer means tranferring charges to said output at a first predetermined speed in response to said first driving signal, said vertical transfer means transferring charges to said output at a second predetermined speed greater than said first predetermined speed in response to said second driving signal; and control means responsive to said start signal for causing said driving means to produce said second driving signal to drive said vertical transfer means for another predetermined period of time which is shorter than the first-mentioned predetermined period of time, said control means causing said driving means to produce said first driving signal to drive said vertical transfer means in response to termination of said another predetermined period of time, wherein said picture signal is produced on the basis of charges which said transfer gate means transfers to said vertical transfer means.

7. A solid state image pick-up device according to claim 6, wherein said control means comprises another timer means responsive to said start signal for counting said another predetermined period of time and for generating another timing signal, and wherein said control means causes said driving means to produce said first driving signal to drive said vertical transfer means in response to said another timing signal.

8. A solid state image pick-up device according to claim 6, which further comprises means for generating a blanking signal indicative of a vertical blanking period of said picture signal and means responsive to said blanking signal for controlling said start means so that said timer means generates said timing signal in said vertical blanking period.

* * * * *